US007449956B2

(12) United States Patent
Ryynänen et al.

(10) Patent No.: US 7,449,956 B2
(45) Date of Patent: Nov. 11, 2008

(54) SEMICONDUCTOR DEVICE

(75) Inventors: Jussi Ryynänen, Vantaa (FI); Jouni Kaukovuori, Vantaa (FI)

(73) Assignee: Nokia Corporation, Espoo (FI)

( * ) Notice: Subject to any disclaimer, the term of this patent is extended or adjusted under 35 U.S.C. 154(b) by 97 days.

(21) Appl. No.: 11/427,867

(22) Filed: Jun. 30, 2006

(65) Prior Publication Data

US 2008/0001673 A1    Jan. 3, 2008

(51) Int. Cl.
*H03F 1/14* (2006.01)
(52) U.S. Cl. .................................. 330/292; 330/307
(58) Field of Classification Search .................. 330/292, 330/307, 302, 277
See application file for complete search history.

(56) References Cited

U.S. PATENT DOCUMENTS

| 4,990,973 | A | * | 2/1991 | Ishikawa et al. | 257/142 |
| 5,164,683 | A | * | 11/1992 | Shields | 330/307 |
| 5,945,878 | A | * | 8/1999 | Westwick et al. | 330/301 |
| 6,300,827 | B1 | * | 10/2001 | King | 330/65 |
| 7,298,213 | B2 | * | 11/2007 | Kang | 330/283 |

OTHER PUBLICATIONS

"Noise Figure and Impedance Matching in RF Cascode Amplifiers" by G. Girlando et al; IEEE Transactions on Circuits and Systems-II: Analog and Digital Signal Processing, vol. 46, No. 11, Nov. 1999.
"Noise Optimization of an Inductively Degenerated CMOS Low Noise Amplifier" by P. Andreani et al; IEEE Transactions on Circuits and Systems-II. Analog and Digital Signal Processing, vol. 48, No. 9, Sep. 2001.

* cited by examiner

*Primary Examiner*—Henry K Choe

(57) ABSTRACT

An inductively degenerated low noise amplifier arrangement is shown having a transistor and a bonding pad connected to the input terminal of the transistor, wherein the bonding pad has parasitic capacitance, and wherein the bonding pad includes a metal layer connected to a second terminal of the transistor. In case of a field-effect transistor the second terminal may be the source and in case of a bipolar transistor the second terminal may be the emitter. The metal layer may be the ground plane of the bonding pad or an additional, intermediate layer.

20 Claims, 5 Drawing Sheets

SEMICONDUCTOR DEVICE

FIELD OF THE INVENTION

The present invention relates generally to electronics and electronic circuits. In particular, the invention concerns degenerated low noise amplifiers (LNA) and devices utilizing those such as radio receivers, integrated circuits, and various wideband applications.

BACKGROUND OF THE INVENTION

An ideal amplifier increases the amplitude of the input signal without adding any distortion or noise thereto. Such ideal amplifier also has minimal NF (noise figure), optimum desired bandwidth and perfect linearity among other favorable factors. However, ideal performance cannot be achieved in practice and therefore the real-life amplifiers tend to introduce artifacts to the signal during the amplification process.

LNAs are often used as a first amplification stage in systems, e.g. (wireless) communications systems, where relatively weak input signals shall be amplified with minimum degradation of signal quality so that the subsequent stages can be implemented with less stringent requirements.

The LNAs are typically constructed as circuits comprising as few transistors as possible to minimize the noise added to the amplified signal. In addition to purely internal noise sources also interference from other elements can negatively affect the LNA performance, this is especially the case if the LNA is integrated on a common die with the other entities, which is often the case.

An LNA can be constructed by utilizing a plurality of different configurations including a resistively matched LNA 102, a feedback LNA 104, a common-base LNA 106 and an inductively-degenerated LNA 108 as visualized in FIG. 1 using bipolar transistors (~bipolar junction transistor, BJT). The inductively degenerated LNAs have been found particularly advantageous as providing low NF with no severe drawbacks.

A simplified example of an inductively degenerated LNA is shown in FIGS. 2A and 2B.

With reference to FIG. 2A and first considering the more generic sketch with reference numeral 202, the LNA includes a MOSFET (Metal Oxide Semiconductor Field-Effect Transistor) transistor 204, a gate-source capacitor 206 and a source inductance 208. In addition, a bonding pad 203, i.e. a metallization area on the surface of a die, to accommodate a bonding wire and couple it to the transistor input is shown in the figure. At high frequencies the parasitic capacitance of the bonding pad 203 decreases the LNA performance. In addition, the parasitics of the pad 203 do not decrease when the transistor area is reduced. This is because, they depend heavily on the pad size and oxide thickness between the lower pad metal and substrate (or a ground shield). The size of the pad 203 cannot be radically decreased since it depends on the width of the bonding wire and the accuracy of the bonding machine. Thus, it is important that the effect of the bonding pad 203 in the LNA input is minimized.

A more detailed structural view of the bonding pad 203 is presented next to the reference numeral 210. Pad 203 internals are specifically highlighted by encompassing them with a broken line in the figure. The bonding pad 203 comprises a parasitic capacitance 214 to the ground and two ESD (electrical static discharge) protection diodes 218. When the pad 203 is connected to the LNA input port, its parasitic capacitance 214 and a substrate resistance 216 can significantly lower the LNA performance. The LNA input matching may be poor and part of the signal leaks to the ground. As a result, the LNA gain reduces and the NF increases. In addition, the substrate resistor 216 is itself an additional noise source degrading the LNA NF. Inductor 212 represents the bonding wire.

With reference to FIG. 2B, more modern processes may produce a slightly different pad. This pad further comprises an additional ground shield 224 (~ground plane) below the upper metal layer(s) 222 and on top of the substrate 226. Such shield 224 is connected to either of the supply rails, whereupon the equivalent circuit does not include substrate resistance 216 thus removing one noisy component from the LNA input; the noise caused by the resistance 216 is shunted to the ground through the shield 224. However, there still exists parasitic capacitance at the LNA input. This capacitance can be taken into account in circuit design, for example, by altering the impedance level at the LNA input. Thus, the effect of this capacitor can be slightly decreased. However, the effect of pad capacitance cannot be completely removed. As a result, the LNA performance degrades as described earlier. In addition, if this capacitance limits the maximum operation frequency of the LNA, no feasible solutions exist to widen it.

SUMMARY OF THE INVENTION

In light of aforesaid problems with LNAs, the current invention provides, as its one aspect, a novel LNA configuration that comprises a transistor and a bonding pad connected to the input terminal of the transistor, wherein said bonding pad comprises an upper metal layer and a lower metal layer, the upper metal layer having capacitive coupling to said lower metal layer that is directly connected to a second terminal of the transistor, the second terminal being the source in case of FET transistors and the emitter in case of BJT transistors, for example. The LNA may be e.g. an inductively degenerated or a resistively degenerated one.

In another aspect of the invention, a semiconductor device comprises a semiconductor substrate, a transistor formed on the substrate, the transistor having an input terminal and a second terminal, and a bonding pad connected to the input terminal of the input transistor, said bonding pad comprising an upper metal layer and a lower metal layer, said lower metal layer connected directly to said second terminal of said transistor.

When aforementioned metal layer such as ground shield of the bonding pad is connected to the source inductor of the LNA rather than to the substrate ground, the negative effect of the parasitic capacitance is neutralized since the source voltage follows the gate voltage. The resulting structure increases the maximum LNA operational frequency, and renders it less sensitive to variations in the bonding pad capacitance.

As a consequence the operational band of the LNA is increased and the overall structure becomes less sensitive to the parasitics of the bonding pad. The inventive concept can be applied to various technologies like MOS, CMOS, BJT, different transceiver/receiver solutions, integrated circuits, etc.

In an embodiment of the invention the metal layer in question is a lower layer like the ground shield (~ground plane) of the bonding pad that is connected to the source of the LNA transistor.

In another embodiment of the invention an additional, intermediate metal layer is provided in the bonding pad and connected to the LNA source whereas the lower layer remains connected to the substrate ground.

BRIEF DESCRIPTION OF THE DRAWINGS

In the following, the invention is described in more detail by reference to the attached drawings, wherein.

DETAILED DESCRIPTION OF THE EXEMPLARY EMBODIMENTS

Figure 1:
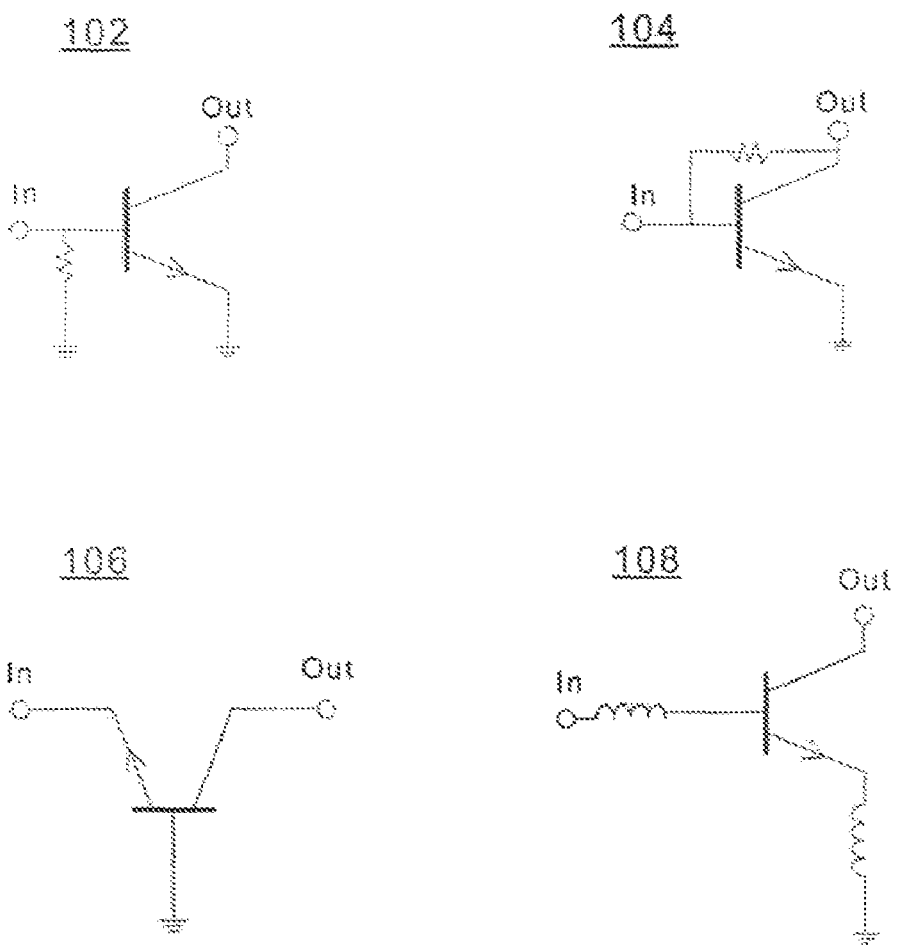
FIG. 1 illustrates various LNA configurations.
Figure 2A:
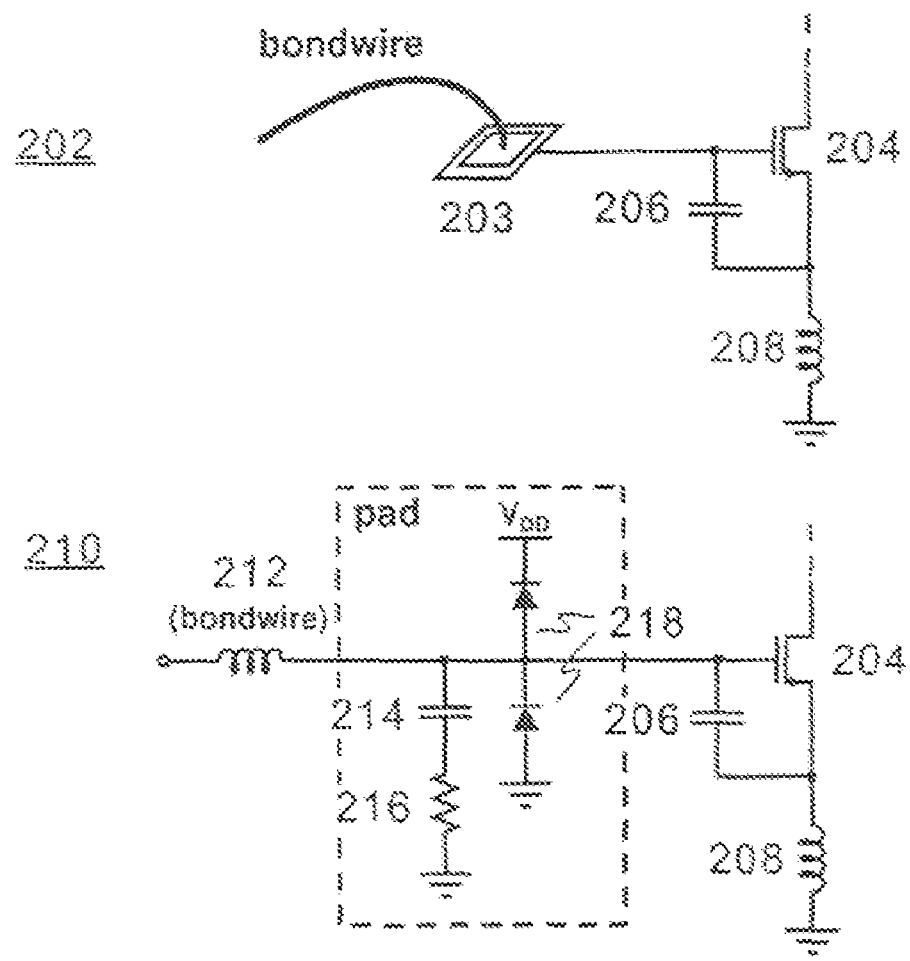
FIG. 2A discloses an inductively degenerated LNA configuration.
Figure 2B:
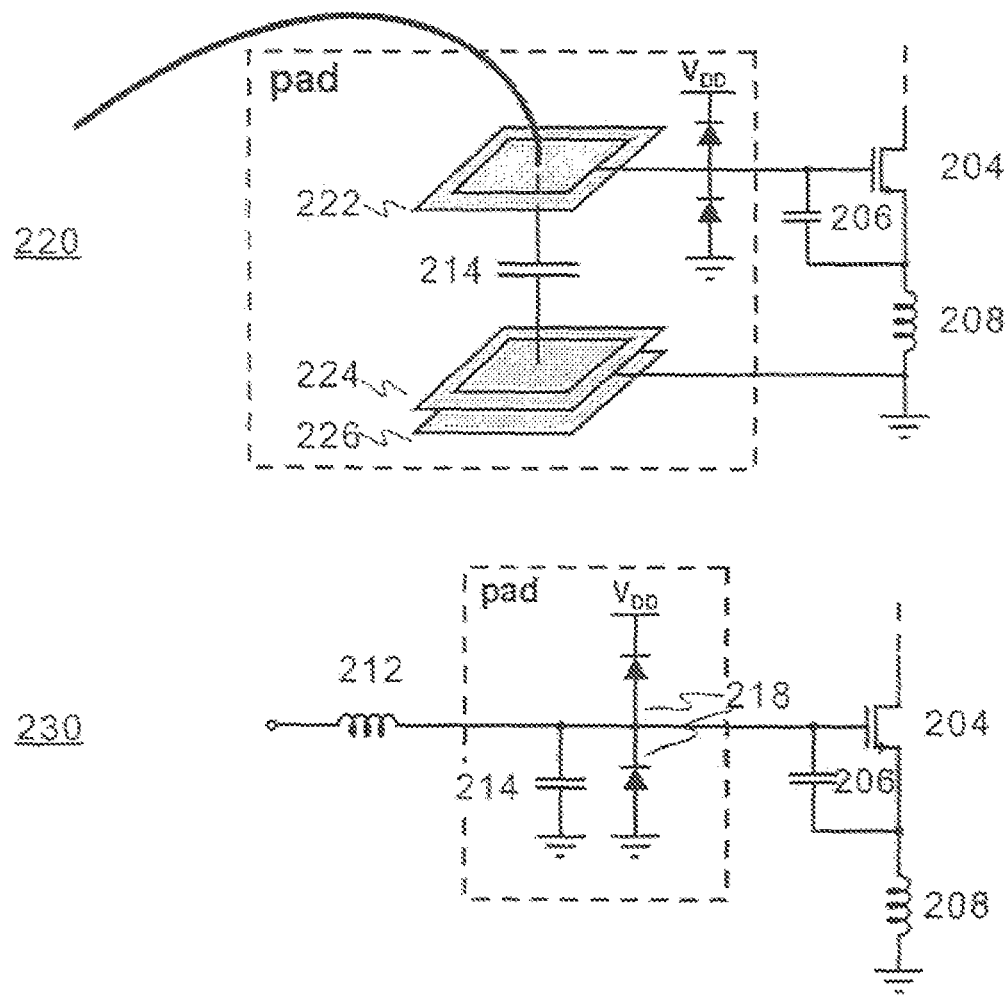
FIG. 2B provides insight to the bonding pad of the LNA shown in FIG. 2A.

FIGS. 1, 2A, and 2B were already reviewed above in conjunction with the analysis of problems relating to the usage of LNAs.

Figure 3:
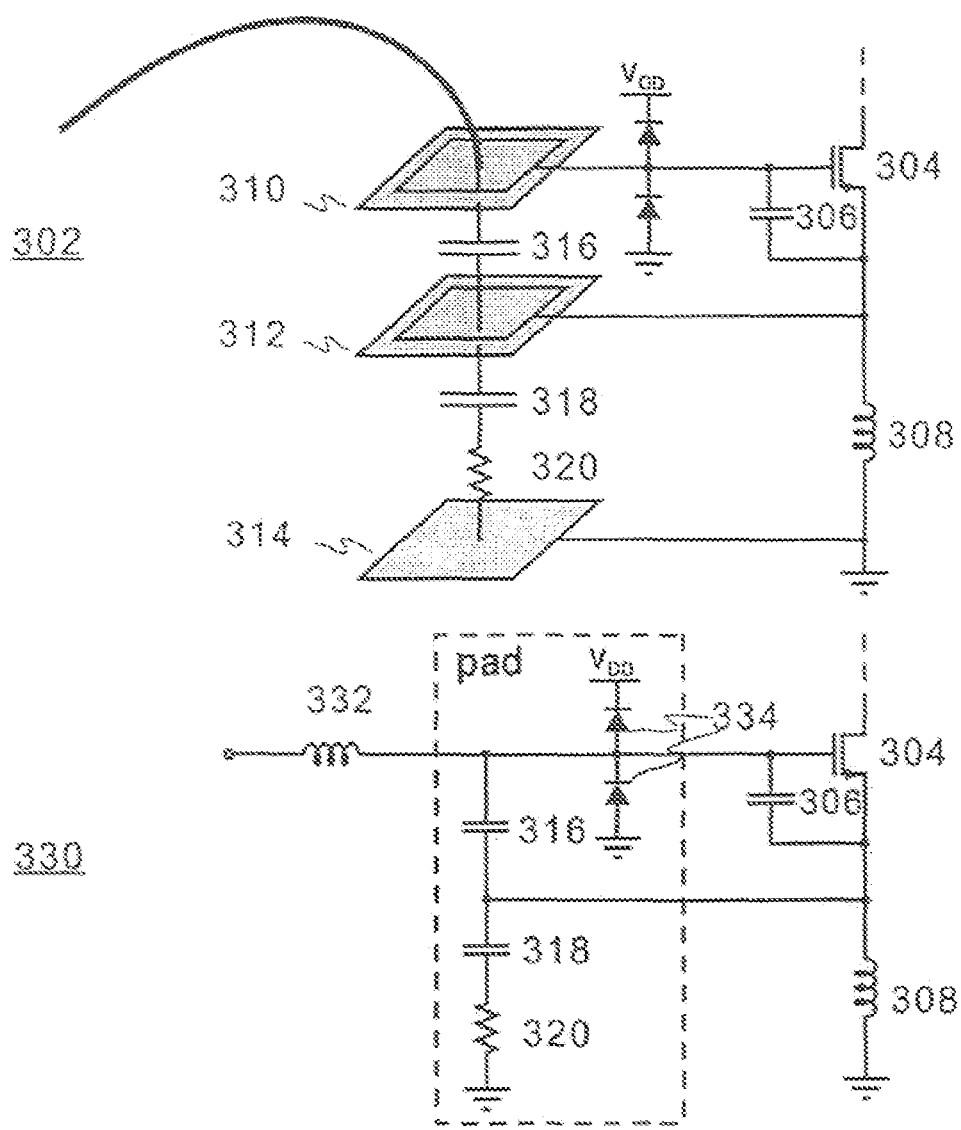
FIG. 3 visualizes the first embodiment of the invention, wherein the ground plane of the bonding pad that is connected to the source of the LNA transistor.

FIG. 3 represents, by way of example only, one possible embodiment of the invention. With reference to the upper sketch 302, the depicted LNA comprises a bonding pad with an upper layer 310, e.g. a top layer adapted to receive the bondwire, and a lower layer, e.g. a ground shield (~plane) 312. The figure further shows a transistor 304, being in this particular example a FET, a gate-source capacitance 306 and a source inductance 308. As the ground shield 312 is directly connected to the source, the parasitic capacitance 316 can actually be used to form at least a part of a gate-source or base-emitter capacitor. Publications [1] and [2] generally disclose how an additional gate-source (or base-emitter) capacitor may be utilized but so far these kinds of capacitors have been implemented via IC (integrated circuit) capacitors. The current invention cleverly brings in a possibility to capitalize the pad parasitic capacitance for the purpose. Element 314 indicates the substrate in the figure.

In a lower sketch 330 a corresponding circuit model is shown. Inductor 332 represents e.g. the bonding wire. The additional parasitics including a capacitor 318 and a resistor 320 (substrate resistance) are connected to a node that joins the source of the transistor 304. However, the parasitic at this node are not as crucial as in the gate node, i.e. this parasitic can be considered in a similar manner with the parasitic from the source inductor. Therefore, the effect of this parasitic is minor.

The ESD protection diodes 334 remain unaltered. Thus, the parasitic from these may still degrade LNA performance. However, the effect thereof is somewhat minimal compared to the pad parasitic capacitance.

When the parasitic capacitance limits the maximum operation frequency, which may take place e.g. in UWB (ultra-wideband) LNA applications, the invented configuration can be used to widen the LNA operation band. Likewise, the pad capacitance can be used to achieve a smaller NF. For example, the minimum NF can be achieved in WCDMA LNA applications. Thus, the embodiments of this invention may be utilized, in addition to mere UWB LNAs, also in many other applications including most wireless systems such as GSM (Global System for Mobile Communications), WCDMA (Wideband Code Division Multiple Access), Bluetooth, etc.

Figure 4:
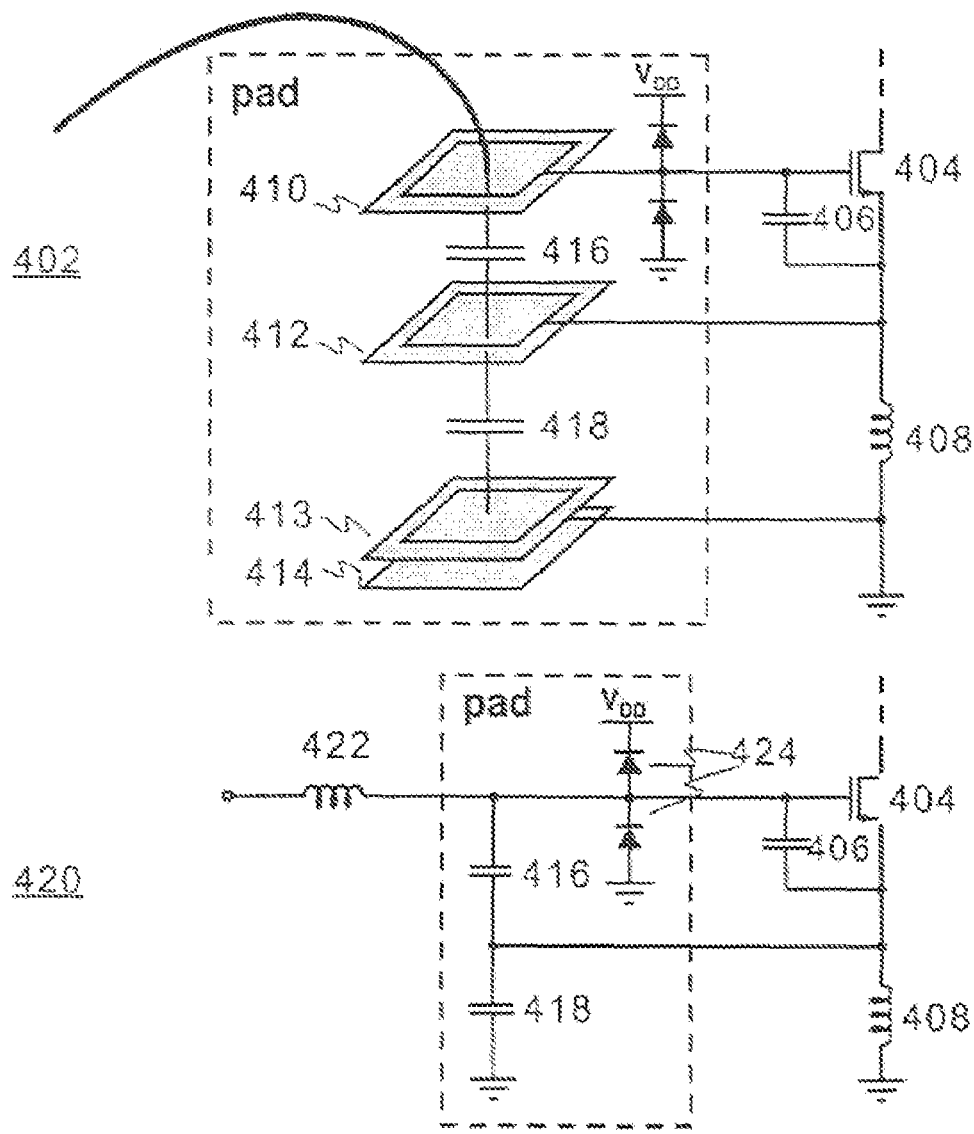
FIG. 4 visualizes the second embodiment of the invention, wherein the additional metal layer is connected to the LNA source.

FIG. 4 discloses a further potential embodiment of the current invention. The upper sketch 402 visualizes a bonding pad structure with upper 410 and lower (~ground shield) 413 layers. Further, a transistor 404, a gate-source capacitor 406, an inductance 408 and substrate 414 are shown. This time an additional, intermediate metal layer 412 is added to the bonding pad configuration of figure 3. Such intermediate layer 412, instead of the ground shield 413, is directly connected to the source of the transistor 404. Accordingly, the effect of substrate resistance can be neutralized, but both the parasitic capacitors 416 and 418 are slightly larger in contrast to the bonding pad of FIG. 3.

It shall be noted that the capacitor 416 is often modeled by circuit vendors but the capacitor 418 is not. Thus, the size of the capacitor 418 should be checked prior to usage by performing parasitic extraction from the layout. However, according to the simulations, the capacitor 418 has a small effect to the overall LNA performance.

The lower sketch 420 in FIG. 4 discloses a corresponding circuit model wherein an inductor with reference numeral 422 represents the bonding wire and a reference numeral 424 points at the ESD protection diodes.

The scope of the invention is found in the following claims. Although a few more or less focused examples were given in the text about the invention's applicability and feasible implementation, the purpose thereof was not to restrict the usage area of the actual fulcrum of the invention to any certain occasion, which should be evident to skilled readers. For example, although the above embodiments have been set forth using (MOS)FET transistors, the invention is applicable to also other transistor types including BJT transistors.

REFERENCES

[1] P. Andreani, H. Sjöland, "Noise optimization of an inductively degenerated CMOS low noise amplifier," IEEE Trans. on Circuits and Systems—II: Analog and Digital Signal Processing, vol. 48, no. 9, September 2001, pp. 835-841.

[2] G. Girlando, G. Palmisano, "Noise Figure and Impedance Matching in RF Cascode Amplifiers," IEEE Trans. on Circuits and Systems—II: Analog and Digital Signal Processing, vol. 46, no. 11, November 1999, pp. 1388-1396.

The invention claimed is:

1. A low noise amplifier arrangement comprising a transistor and a bonding pad connected to an input terminal of the transistor, said bonding pad comprising an upper metal layer and lower metal layer, said upper metal layer having capacitive coupling to said lower metal layer connected directly to a second terminal of the transistor.

2. The amplifier arrangement of claim 1, wherein said transistor is a field-effect transistor and said second terminal is a source of said field-effect transistor.

3. The amplifier arrangement of claim 1, wherein said transistor is a bipolar junction transistor and said second terminal is an emitter of said bipolar junction transistor.

4. The amplifier arrangement of claim 1, wherein said lower metal layer is a ground shield of the bonding pad.

5. The amplifier arrangement of claim 1, wherein said lower metal layer is an intermediate layer between a ground shield of the bonding pad and said upper layer of the bonding pad.

6. The amplifier arrangement of claim 1, wherein said lower metal layer is configured to form a capacitor between the input terminal and said second terminal, wherein said second terminal is selected from the group consisting of: the source of said transistor being a field-effect transistor, and the emitter of said transistor being a bipolar junction transistor.

7. A semiconductor device comprising
a semiconductor substrate, a transistor formed on the substrate, the transistor having an input terminal and a second terminal, a bonding pad connected to the input terminal of the transistor, said bonding pad comprising an upper metal layer and a lower metal layer, said lower metal layer connected to directly said second terminal of said transistor.

8. The device of claim 7, wherein said transistor is a field-effect transistor and said second terminal is a source of said field-effect transistor.

9. The device of claim 7, wherein said transistor is a bipolar junction transistor and said second terminal is an emitter of said bipolar junction transistor.

10. The device of claim 7, wherein said lower metal layer is a ground shield of the bonding pad.

11. The device of claim 7, wherein said lower metal layer is an intermediate layer between a ground shield of the bonding pad and said upper metal layer of the bonding pad.

12. The device of claim 7, comprising an inductively degenerated low noise amplifier.

13. The device of claim 7, comprising a resistively degenerated low noise amplifier.

14. A receiver comprising the amplifier arrangement of claim 1.

15. An integrated circuit comprising the amplifier arrangement of claim 1.

16. The use of a parasitic bonding pad capacitance as a base-emitter capacitor in a low noise amplifier arrangement of claim 1.

17. The use of a parasitic bonding pad capacitance as a gate-source capacitor in a low noise amplifier arrangement of claim 1.

18. A method for arranging a low noise amplifier, comprising connecting a bonding pad to an input terminal of a transistor, said bonding pad comprising an upper metal layer and a lower metal layer with a capacitive coupling therebetween, and connecting said lower metal layer directly to a second terminal of the transistor.

19. The method of claim 18, wherein said lower metal layer is a ground shield of the bonding pad.

20. The method of claim 18, wherein said lower metal layer is an intermediate layer between a ground shield of the bonding pad and said upper layer of the bonding pad.

* * * * *